United States Patent [19]
Takahashi

[11] Patent Number: 5,118,980
[45] Date of Patent: Jun. 2, 1992

[54] PIEZOELECTRIC VIBRATION COMPONENT

[75] Inventor: Hiroyuki Takahashi, Takaoka, Japan

[73] Assignee: Murata Manufacturing Co., Ltd., Kyoto, Japan

[21] Appl. No.: 620,432

[22] Filed: Nov. 30, 1990

Related U.S. Application Data

[63] Continuation of Ser. No. 376,598, Jul. 7, 1989, abandoned.

Foreign Application Priority Data

Jul. 9, 1988 [JP] Japan .................. 63-171615

[51] Int. Cl.⁵ .............................................. H01L 41/08
[52] U.S. Cl. ...................................... 310/320; 310/358; 310/366; 310/340
[58] Field of Search ............... 310/320, 358, 359, 365, 310/366

[56] References Cited

U.S. PATENT DOCUMENTS 3,593,219  7/1971  Tsuchiya ................... 310/358 X
4,356,421  10/1982  Shimizu et al. ........... 310/358 X

FOREIGN PATENT DOCUMENTS 57-91016  6/1982  Japan .
60-98711  6/1985  Japan .
60-134618  7/1985  Japan .
0661660  5/1979  U.S.S.R. .................. 310/358

Primary Examiner—Mark O. Budd
Attorney, Agent, or Firm—Wenderoth, Lind & Ponack

[57] ABSTRACT

A piezoelectric vibration component of an energy trapped type operable in a thickness slip vibration mode includes a piezoelectric substrate having front and back faces and rectangular configuration with long and short sides. The piezoelectric substrate is polarized in a direction approximately parallel to the short side of the piezoelectric substrate. Vibrating electrode members are deposited on the front and back faces of the piezoelectric substrate.

10 Claims, 5 Drawing Sheets

PIEZOELECTRIC VIBRATION COMPONENT

This application is a continuation of now abandoned application, Ser. No. 07/376,598 filed on Jul. 7, 1989.

BACKGROUND OF THE INVENTION

1. Field of the Invention

The present invention relates to a piezoelectric vibration component, specifically a piezoelectric vibration component which uses an energy trapped type thickness slip vibration mode. Furthermore, a piezoelectric vibration component according to the present invention can be used as a piezoelectric trap, a piezoelectric filter, a piezoelectric discriminator, or a piezoelectric oscillator.

2. Description of the Prior Art

FIG. 8 shows a piezoelectric trap element which is one conventional example of a member of a piezoelectric vibration component. Piezoelectric substrate 21 is formed into a rectangular shape from a ceramic or other piezoelectric material. The substrate is processed so that the direction of polarization axis P is parallel to the long side of the piezoelectric substrate 21. Furthermore, a vibrating electrode member 22 and a terminal member 23 are formed by vapor deposition, sputtering, or other thin film formation technique on the front and back surfaces of piezoelectric substrate 21. With this piezoelectric vibration element D, energy trap-type thickness slip vibrations are set up in piezoelectric substrate 21 when an alternating current signal is applied to vibrating electrode member 22. The resonance frequency fo of these vibrations is determined by the thickness of the piezoelectric substrate 21, the mass of the vibrating electrode member 22, and other factors.

Moreover, this piezoelectric vibration element D forms piezoelectric vibration member 26 (FIG. 9) when a lead terminal (not shown in the figures) is soldered to terminal member 23, and packaging resin layer 24 is formed around piezoelectric vibration element D by an epoxy resin or other packaging resin. Therefore, as shown in FIG. 9, piezoelectric substrate 21 is held firmly at a position inside packaging resin layer 24, and a hollow vibration space 25 is formed between packaging resin layer 24 and vibrating electrode member 22 so that the vibrations in vibrating electrode member 22 are not damped by packaging resin layer 24.

Because piezoelectric vibration element D is thus covered by packaging resin layer 24 to form piezoelectric vibration member 26, clamping stress from packaging resin layer 24 may be applied, and thermal stress between packaging resin layer 24 and piezoelectric substrate 21 may occur due to the difference in the coefficients of thermal expansion of packaging resin layer 24 and piezoelectric substrate 21, or to changes in the operating temperature. If a stress F is applied, due to one of these factors, in the clamping direction to piezoelectric substrate 21, a change (shift) from the design value will occur in resonance frequency fo as indicated by A in FIG. 4. Thus, the greater stress F becomes, the greater becomes the change Δ-f in the resonance frequency. Possible reasons for this include the following. Specifically, due to contraction deformation in the length and width directions of piezoelectric substrate 21 caused by stress F, elongation deformation in the thickness direction of piezoelectric substrate 21 arises at vibrating electrode member 22 enclosed within vibration space 25. Thus, the frequency of the standing wave occurring in the thickness direction of piezoelectric substrate 21 in vibrating electrode member 22 decreases, and it may be concluded that as a result the frequency of the wave propagated in the lengthwise direction increases.

Therefore, in a conventional piezoelectric vibration component, when stress is applied to the piezoelectric substrate from the external resin layer, a large change proportional to the resonance frequency will occur which decreases the reliability of the piezoelectric vibration component. In particular, because a change in the resonance frequency occurs due to the thermal stress accompanying a temperature change, there have been problems in the thermal characteristics of piezoelectric vibration components. To resolve these problems, research has been advanced in the development of new piezoelectric materials characterized by minimal change in the resonance frequency, and in the development of suitable packaging resins to achieve a minimal difference in the coefficients of thermal expansion between the piezoelectric substrate and the packaging material.

The present invention has as its objective to reduce the change in the resonance frequency produced in conjunction with temperature changes, and improve the characteristics of the piezoelectric vibration component.

To this end, we inventors prepared various piezoelectric vibration elements using a piezoelectric substrate processed with the polarity aligned in the lengthwise direction and in which the length of the long side and short side of the piezoelectric substrate was changed. A compression stress was applied to these various piezoelectric vibration element materials, and the change in the resonance frequency at that time was measured. As a result of these measurements, it was found that the rate of change of the resonance frequency to stress (the tangent of lines A and B in FIG. 4) increased proportionally to the length of the long side of the piezoelectric substrate. However, piezoelectric vibration elements have already been reduced as much as possible in size due to the demand for the micronization of components, and there is a limit to how much the length of the piezoelectric substrate can be reduced due to the dimensions of the vibration electrode member and other technological restrictions. Therefore, we further extended the scope of our experiments and manufactured a piezoelectric vibration element in which the polarization axis is parallel for all intents and purposes to the short side of the piezoelectric substrate (in a conventional piezoelectric vibration element, the direction of the polarization axis is parallel to the long side of the substrate). These samples were then used in tests in which the amount of compression stress applied to the piezoelectric substrate was varied and the resonance frequency was measured, and it was found that the change in the resonance frequency was small.

A comparison of the change in the resonance frequency of piezoelectric vibration elements of the same dimension when the polarization axis is parallel to the long side and when parallel to the short side is shown in the graph of FIG. 4. The x-axis is the stress applied in the clamping direction, and the y-axis shows the change in resonance frequency. Line A represents the piezoelectric vibration element in which the polarization axis is parallel to the long side of the piezoelectric substrate, and B represents the piezoelectric vibration element in which the polarization axis is parallel to the short side of the piezoelectric substrate. As is obvious from the graph, the change (and the rate of change) in the resonance frequency is significantly less in a piezoelectric vibration element with the polarization axis parallel to the short side of the piezoelectric substrate than in a piezoelectric vibration element in which the polarization axis is parallel to the long side of the piezoelectric substrate.

From the above experiments, we came to a conclusion that the change in the resonance frequency can be more efficiently reduced not by shortening the length of the long side of the piezoelectric substrate, but by actually reducing the dimension of the piezoelectric substrate in the direction of the polarization axis.

SUMMARY OF THE INVENTION

A piezoelectric vibration component according to the present invention is an energy trapped type, thickness slip vibration mode piezoelectric vibration component comprising vibration electrode members on the front and back surfaces of a piezoelectric substrate having long and short sides, and characterized by the alignment of the polarization axis in the direction of the short side of said piezoelectric substrate.

In the present invention, because the polarization axis of the piezoelectric substrate is aligned more with the short side than with the long side of the piezoelectric substrate, the length of the piezoelectric substrate in the direction of the polarization axis is shorter when compared with a conventional piezoelectric substrate in which the polarization axis is parallel to the long side of the piezoelectric substrate, even when using substrates of equal dimensions. As a result, based on the findings obtained from the experiments as described above, the change in the resonance frequency of the piezoelectric vibration component when stress is applied can be reduced.

Thus, in a piezoelectric vibration component covered by an external resin packaging layer, even if thermal stress occurs between the piezoelectric substrate and the packaging layer due to a change in operating temperature or other conditions, the change in the resonance frequency caused by this stress can be reduced, and a piezoelectric vibration component with excellent thermal characteristics can be obtained. Likewise, the change in resonance frequency caused by clamping stress applied to the piezoelectric substrate by contraction during the hardening of the packaging resin can also be reduced, and a piezoelectric vibration component with small fluctuations in the resonance frequency can be obtained.

Moreover, the present invention also reduces the change in resonance frequency by the simple method of changing the direction of the polarization axis from the direction of a conventional component (aligned with the long side of the piezoelectric substrate), and is therefore not accompanied by the technical problems arising from making the piezoelectric substrate smaller when the length of the long side aligned with the polarization axis of the piezoelectric vibration element is shortened. Moreover, because it is not necessary to develop new piezoelectric substrate materials with a small change in the resonance frequency, and the change in the resonance frequency can be reduced using the same packaging resins and piezoelectric materials having the same Young's modulus and coefficient of thermal expansion as current materials, the present invention can be easily implemented.

BRIEF DESCRIPTION OF THE DRAWINGS

The above and other objects and features of the present invention will become apparent from the following description taken in conjunction with preferred embodiments thereof with reference to the accompanying drawings, throughout which like parts are designated by like reference numerals, and in which.

DETAILED DESCRIPTION OF THE PREFERRED EMBODIMENTS

The present invention is described herein below with reference to the accompanying drawings.

Figure 1:
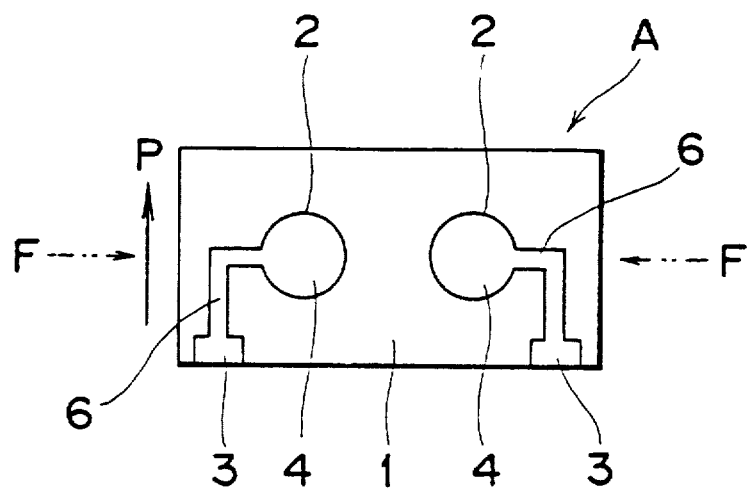
FIGS. 1 and 2 are the front and back plan views, respectively, of a piezoelectric vibration component according to a first of the present invention.
Figure 2:
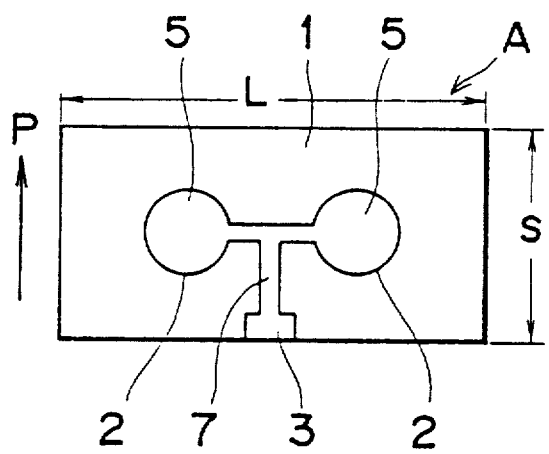
Figure 1B:
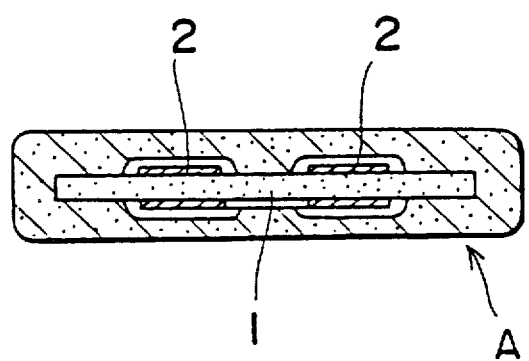
FIG. 1b is a cross-sectional view of the piezoelectric vibration component of FIG. 1 provided in a packaging resin layer.

Referring to FIGS. 1 and 2, front and back plan views, respectively, of a piezoelectric vibration element A is shown. Piezoelectric vibration element A is provided with a vibration electrode member 2 to generate energy trap-type vibrations, and terminal member 3 to connect a lead terminal (not shown) on the front and back of a thin piezoelectric substrate 1.

Piezoelectric substrate 1 is formed from a piezoelectric ceramic material into rectangular thin sheet, and then baked. Furthermore, this piezoelectric substrate 1 is polarized by applying a voltage in a direction parallel to the short side of the substrate, and therefore has a polarization axis P in the direction parallel to the short side of the substrate as indicated by a bold line arrow shown in FIGS. 1 and 2. Of course, while this alignment is said to be parallel, there is a certain width of allowance for error. On the front and back surfaces of the piezoelectric substrate 1 are formed metallic thin film vibration electrode members 2, terminal members 3, and connection conductors 6 and 7 using a vapor deposition, sputtering, or other thin film formation technology. Vibration electrode member 2 places vibration electrode 4 on the front surface of piezoelectric substrate 1 and common electrode 5 on the back of piezoelectric substrate 1 in opposition, thus producing the vibrations of the thickness slip vibration mode between vibration electrode 4 and common electrode 5.

Figure 3:
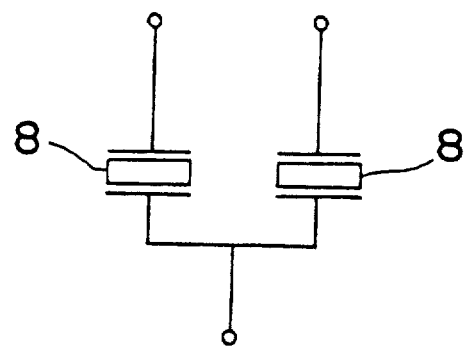
FIG. 3 is a circuit diagram showing an equivalent circuit of the piezoelectric vibration component shown in FIGS. 1 and 2.
Figure 4:
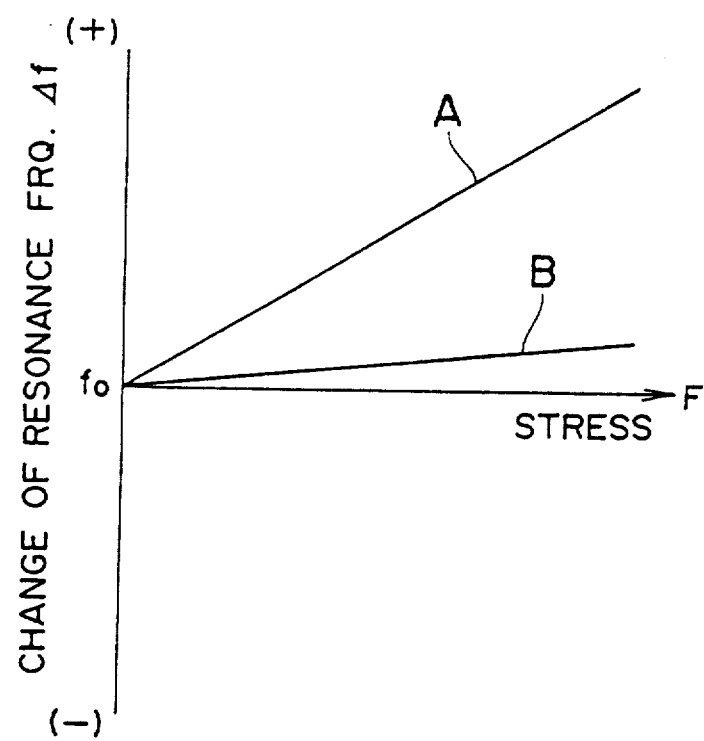
FIG. 4 is a graph showing the change in the resonance frequency of a piezoelectric vibration component according to the present invention and that according to a conventional embodiment.

In the embodiment shown in FIGS. 1 and 2, two vibration electrode members 2 are formed on piezoelectric substrate 1, such that vibration electrodes 4 are connected to respective terminal members 3 on both sides of the front surface through connection conductors 6 and common electrode 5 on the back is connected to terminal member 3 in the center via a common connection conductor 7. An electrical equivalent circuit is shown in FIG. 3, in which two terminal oscillators 8, 8 connected in parallel.

This piezoelectric vibration element A ca produce energy trap-type thickness slip vibrations by applying an AC signal to vibration electrode member 2, and the resonance frequency fo of these vibrations is largely determined by the thickness of piezoelectric substrate 1. Furthermore, because the direction of polarization axis P is parallel to the short side, the length of piezoelectric substrate 1 in the direction of polarization axis P is much shorter in a piezoelectric substrate of the same dimensions. Also, as is clear from the aforementioned experiments, the change $\Delta f$ in the resonance frequency, when stress is applied to piezoelectric vibration element A, is smaller. Therefore, a piezoelectric vibration element A with good thermal characteristics is obtained, specifically, an element is obtained in which the change f in the resonance frequency is small even if thermal stress occurs between the substrate and the resin packaging layer covering piezoelectric vibration element A. Also, the ratio of change $\Delta f/fo$ of the resonance frequency to the temperature change $\Delta T$ is reduced. For example, in a piezoelectric trap using a piezoelectric substrate of which the length of the long side is L=6.7 mm and the length of the short side is 2.8 mm, the ratio of change $(\Delta f/\Delta T)/fo$ will be $-50$ ppm/° C. when the polarization axis is aligned with the long side, but the same will be $+5$ ppm/° C. when the polarization axis is aligned with the short side. It is understood that the ratio of change has been improved by one tenth.

Figure 5:
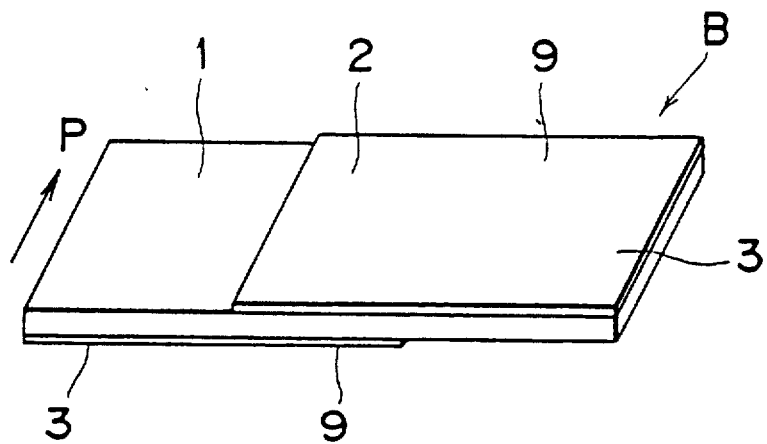
FIG. 5 is a perspective view showing an alternative embodiment of the present invention.

Referring to FIG. 5, an alternative embodiment according to the present invention is shown. A strip electrode layer 9 of a metallic thin film is formed on the front and back of a rectangular piezoelectric 1 sheet. At the center of piezoelectric substrate 1 on opposing strip electrode layers 9 is the two terminal-type vibration electrode member 2, and at the ends of strip electrode layers 9 are terminal members 3, thus forming an energy trap-type thickness slip vibration mode piezoelectric vibration element B. In a piezoelectric vibration element B of this type too, the change in resonance frequency can be minimized by aligning the direction of polarization axis P parallel to the short side of piezoelectric substrate 1.

Figure 6A:
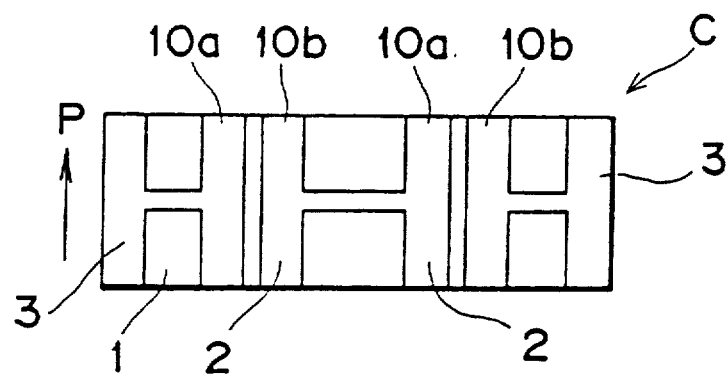
FIGS. 6(a) and 6(b) are front and back views, respectively, of an alternative embodiment according to the present invention.
Figure 6B:
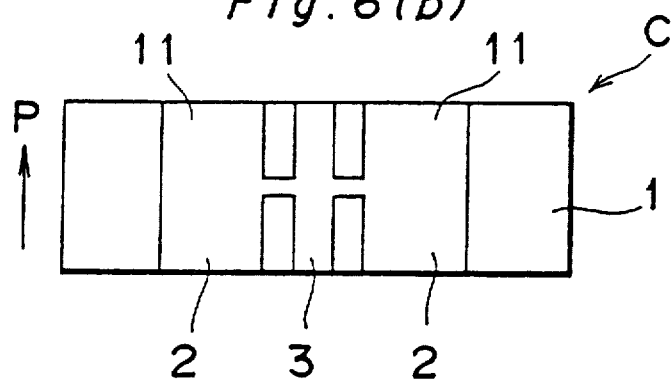
Figure 7:
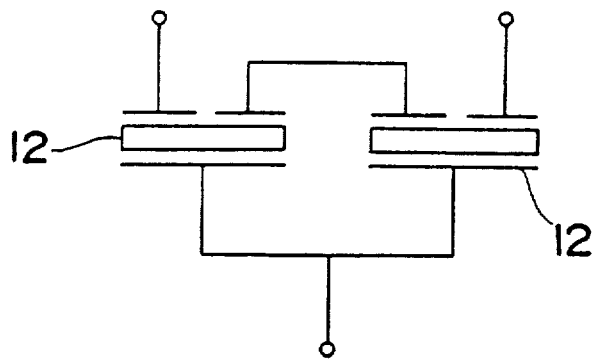
FIG. 7 is a circuit diagram showing an equivalent circuit of the piezoelectric vibration component shown in FIGS. 6(a) and 6(b)
Figure 8:
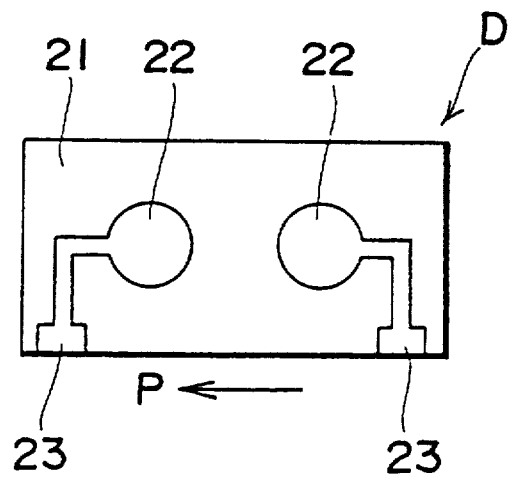
FIG. 8 is a top plan view of a piezoelectric vibration component according to the prior art.
Figure 9:
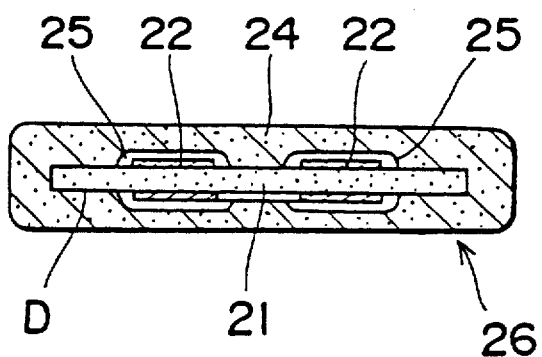
FIG. 9 is a cross-sectional view of the piezoelectric vibration component of FIG. 8 provided in a packaging resin layer.

Referring to FIGS. 6(a) and 6(b), front and back views of a piezoelectric vibration element C is shown, in which two vibration electrode members 2 comprised of a pair of divided electrodes 10a and 10b and common electrode 11 are formed on piezoelectric substrate 1, thus forming an energy trap-type thickness slip vibration mode piezoelectric vibration element C connected in parallel to two three terminal oscillators 12, as shown in FIG. 7. In this type of piezoelectric vibration element C, the change in resonance frequency can be minimized by aligning the direction of polarization axis P parallel to the short side of piezoelectric substrate 1.

It is to be noted that an energy trap-type thickness slip vibration mode piezoelectric vibration element according to the present invention can be constructed other than those described above. Furthermore, according to a preferred embodiment, the direction of the polarization axis is parallel to the short side of the piezoelectric substrate, but it is not necessary for the direction of the polarization axis to be literally parallel to the direction of the short side. In other words, the change in resonance frequency can be made less than that of a conventional element by aligning the polarization axis closer to the short side direction than to the long side direction of the piezoelectric substrate. Therefore, in a rectangular piezoelectric substrate as described above, it is sufficient for the angle formed by the polarization axis and the direction of the short side to be less than 45 degrees. However, in a parallel quadrilateral the angle will not necessarily be less than 45 degrees.

According to the present invention, the change in the resonance frequency when stress is applied to the piezoelectric substrate can be reduced. Therefore, an element with excellent thermal characteristics in which the change in the resonance frequency will be small even if thermal stress is applied to the piezoelectric vibration element from the resin packaging layer by a change in the operating temperature or other conditions can be achieved. Furthermore, a piezoelectric vibration element with high reliability in which the variation in resonance frequency is small and the change in the resonance frequency caused by contraction during hardening of the packaging resin is minimal can be obtained. Moreover, the invention can be achieved by the simple method of changing the orientation of the polarization axis from the direction of conventional elements, and can be implemented easily without the difficulties presented by developing new materials or reducing the size of the piezoelectric substrate.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A piezoelectric vibration component of an energy trapped type operable in a thickness slip vibration mode, comprising:

a piezoelectric substrate having front and back surfaces and a substantially rectangular configuration with long and short sides, said piezoelectric substrate polarized in a direction substantially parallel to said short side of said piezoelectric substrate;

a plurality of trap-type vibration generating electrode components on said front surface of said piezoelectric substrate, all of said electrode components on said front surface being aligned with the other said electrode components on said front surface in a direction substantially perpendicular to said direction of polarization; and a plurality of second electrode components deposited on said back surface of said piezoelectric substrate;

wherein said piezoelectric substrate is polarized in said direction parallel to said short side of said piezoelectric substrate reduces changes in the resonance frequency of said piezoelectric substrate due to stress being applied thereto as compared with having said piezoelectric substrate polarized in a direction parallel to said long side of said piezoelectric substrate.

2. A piezoelectric vibration component as claimed in claim 1, and further comprising:

an external resin packaging layer provided about said substrate, said packaging layer having a cavity around each said of said plurality of first and second electrode.

3. The piezoelectric vibration component as claimed in claim 1, wherein said first plurality of trap-type vibration generating electrode components comprises two electrodes.

4. The piezoelectric vibration component as claimed in claim 3, wherein said two electrodes are disposed on opposite sides of a mid-point of said long side of said piezoelectric substrate.

5. The piezoelectric vibration component as claimed in claim 4, wherein each of said two electrodes has a single terminal member extending to a side of said piezoelectric substrate.

6. The piezoelectric vibration component as claimed in claim 1, wherein said first plurality of trap-type vibration generating electrode components consists of two electrodes.

7. The piezoelectric vibration component as claimed in claim 6, wherein said two electrodes are disposed on opposite sides of a mid-point of said long side of said piezoelectric substrate.

8. The piezoelectric vibration component as claimed in claim 6, wherein each of said two electrodes has a single terminal member extending to a side of said piezoelectric substrate.

9. The piezoelectric vibration component as claimed in claim 1, wherein said first plurality of trap-type vibration generating electrode components comprises two pairs of divided electrodes, a first said pair forming a first vibration electrode and a second said pair forming a second vibration electrode.

10. The piezoelectric vibration component as claimed in claim 9, wherein said first and second vibration electrodes are disposed on opposite sides of a midpoint of said long side of said piezoelectric substrate.

* * * * *